(12) United States Patent
Delshadpour et al.

(10) Patent No.: US 10,498,330 B1
(45) Date of Patent: Dec. 3, 2019

(54) LOW LEAKAGE SWITCH CONTROL CIRCUIT

(71) Applicant: NXP B.V., Eindhoven (NL)

(72) Inventors: Siamak Delshadpour, Phoenix, AZ (US); Xu Zhang, Chandler, AZ (US); Harold Garth Hanson, Queen Creek, AZ (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/184,659

(22) Filed: Nov. 8, 2018

(51) Int. Cl.
*H03K 17/16* (2006.01)
*H01L 27/02* (2006.01)

(52) U.S. Cl.
CPC ....... *H03K 17/165* (2013.01); *H01L 27/0288* (2013.01)

(58) Field of Classification Search
CPC .......................... H03K 17/165; H01L 27/0288
See application file for complete search history.

(56) References Cited

U.S. PATENT DOCUMENTS

| | | | |
|---|---|---|---|
| 6,842,318 B2 | 1/2005 | Comeau | |
| 8,174,282 B2 * | 5/2012 | Fujii | G01R 31/2621 257/48 |
| 9,461,545 B2 * | 10/2016 | Zhang | H02M 3/158 |
| 2006/0087362 A1 | 4/2006 | O'Halloran et al. | |
| 2012/0206188 A1 | 8/2012 | Duong | |

OTHER PUBLICATIONS

Wang, L. et al, "A Low-Power Forward and Reverse Body Bias Generator in CMOS 40nm", IEEE Transactions on Very Large Scale Integration (VLSI) Sytems, vol. 26, No. 7, pp. 1403-1407. (Jul. 2018).

* cited by examiner

*Primary Examiner* — Dinh T Le

(57) ABSTRACT

A low-leakage circuit including a switch having an input node, gate, bulk region, and pin node, a comparison circuit configured to determine and output a greater of two voltages of the switch, a latching circuit connected to the comparison circuit and configured to bias the gate and the bulk region of the switch using the greater of the two voltages, and a shorting circuit configured to control a voltage at the bulk region to ensure that no leakage current flows from the pin node.

20 Claims, 4 Drawing Sheets

LOW LEAKAGE SWITCH CONTROL CIRCUIT

TECHNICAL FIELD

Example embodiments disclosed herein relate generally to a control circuit for a low leakage PMOS switch.

SUMMARY

A brief summary of various example embodiments is presented below. Some simplifications and omissions may be made in the following summary, which is intended to highlight and introduce some aspects of the various example embodiments, but not to limit the scope of the invention. Detailed descriptions of example embodiments adequate to allow those of ordinary skill in the art to make and use the inventive concepts will follow in later sections.

Example embodiments include a low-leakage switch control circuit including a switch having an input node, gate, bulk region, and pin node, a comparison circuit configured to determine and output a greater of two voltages of the switch, a latching circuit connected to the comparison circuit and configured to bias the gate and the bulk region of the switch using the greater of the two voltages, and a shorting circuit configured to control a voltage at the bulk region to ensure that no leakage current flows from the pin node.

The switch may be a PMOS switch.

The comparison circuit may include a pair of PMOS transistors connected in series, and be configured to determine a greater voltage between a supply voltage and a drain voltage of the switch.

The comparison circuit may include a plurality of resistors configured to provide electrostatic discharge protection for gates of the PMOS transistors.

The pair of PMOS transistors are connected at respective source regions. The pair of PMOS transistors are connected at respective bulk regions. The respective bulk regions are connected to a node of the latching circuit.

The latching circuit may include a PMOS latch and an enabling circuit.

The shorting circuit may include an inverter to receive a supply voltage and a PMOS transistor to receive an inverse of the supply voltage from the inverter.

A bulk of the PMOS transistor may be connected to the bulk region of the PMOS switch.

The inverter may receive power from the bulk region of the PMOS switch.

Example embodiments also include a method of limiting switch leakage, including determining and outputting using a comparison circuit a greater voltage between a first voltage at an input node of a switch and a second voltage at a pin node of the switch, biasing a gate and a bulk region of the switch using a latching circuit using the greater of the two voltages, and controlling a voltage at the bulk region using a shorting circuit to ensure that no leakage current flows from the pin node.

Determining a greater voltage includes determining a greater voltage between a supply voltage and a pin voltage of the switch.

The comparison circuit may include a pair of PMOS transistors connected in series at respective source regions and bulk regions.

The method may include providing electrostatic discharge protection for gates of the PMOS transistors using a plurality of resistors of the comparison circuit.

Controlling a voltage at the bulk region may include the shorting circuit receiving through an inverter a supply voltage and a PMOS transistor to receiving an inverse of the supply voltage from the inverter at a PMOS transistor.

BRIEF DESCRIPTION OF THE DRAWINGS

Additional objects and features of the invention will be more readily apparent from the following detailed description and appended claims when taken in conjunction with the drawings. Although several example embodiments are illustrated and described, like reference numerals identify like parts in each of the figures, in which:

Figure 3:
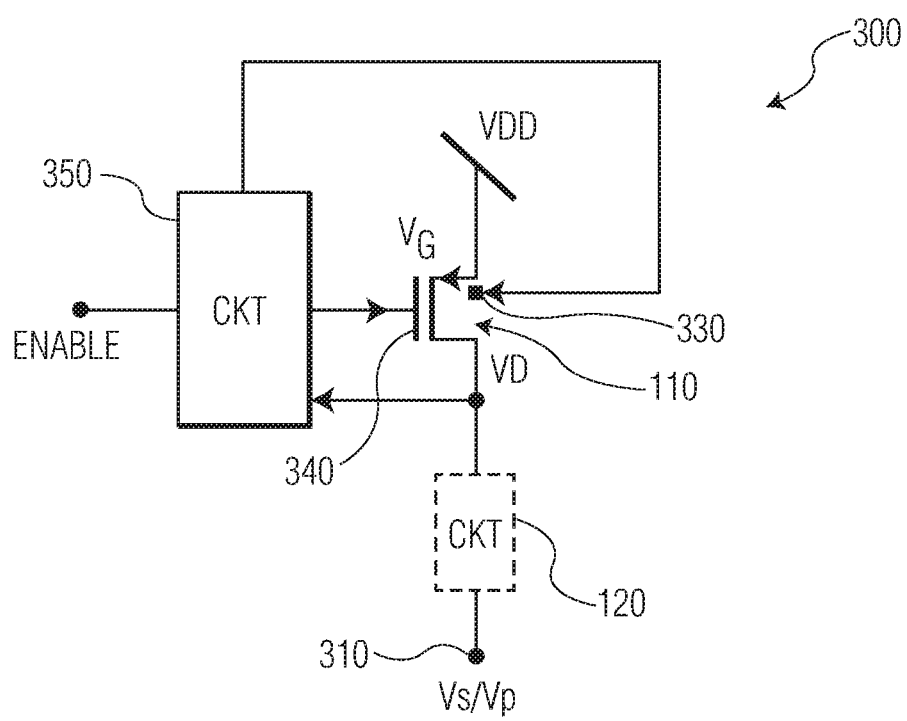

FIB. 2 illustrates a switch connected to a power supply;

FIG. 3 illustrates a control circuit added to control bulk and gate of PMOS for guaranteed OFF state and zero leakage in all conditions.

Figure 4:
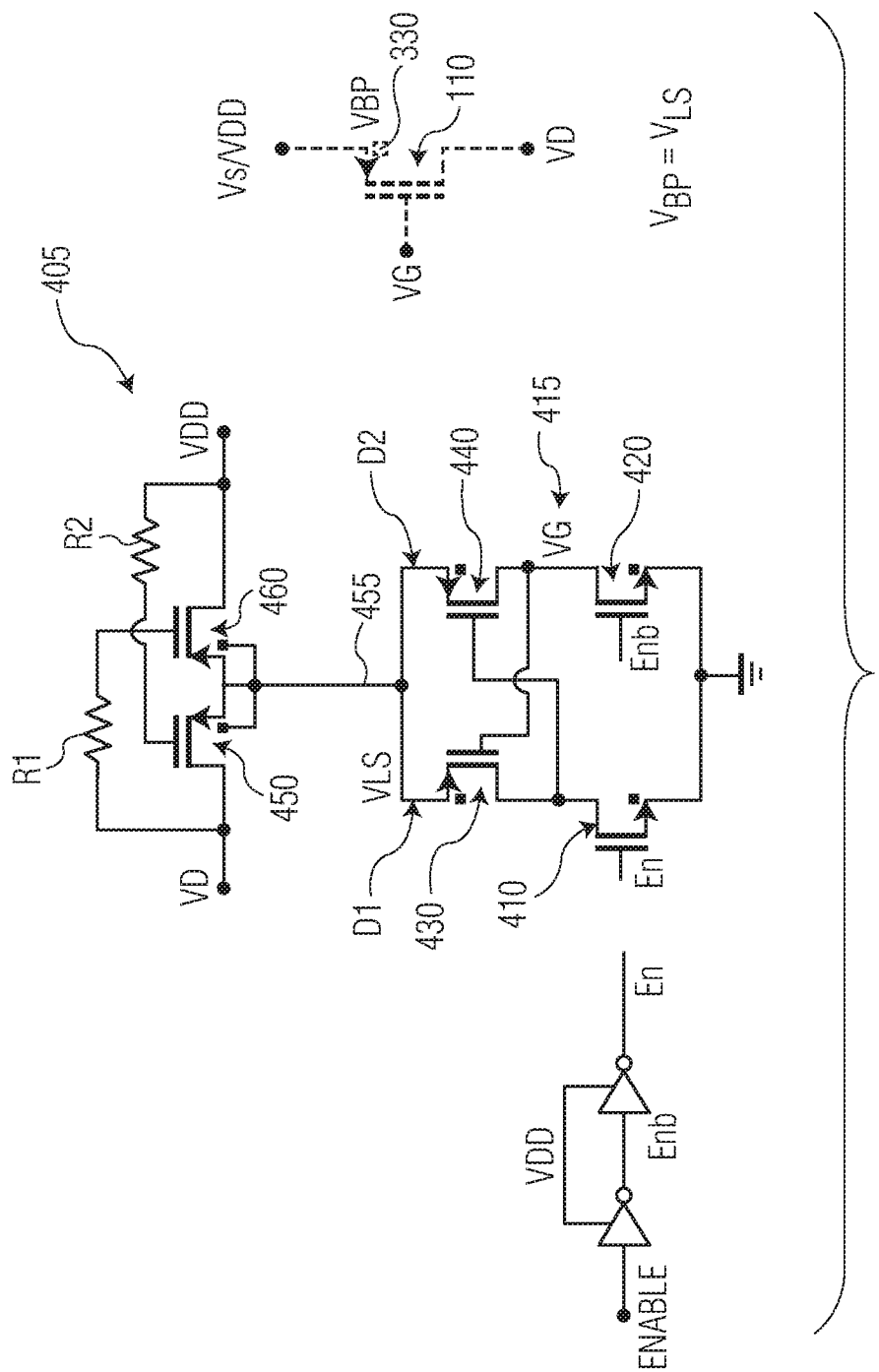

FIG. 4 illustrates a control circuit to make a low leakage PMOS switch; and

Figure 5:
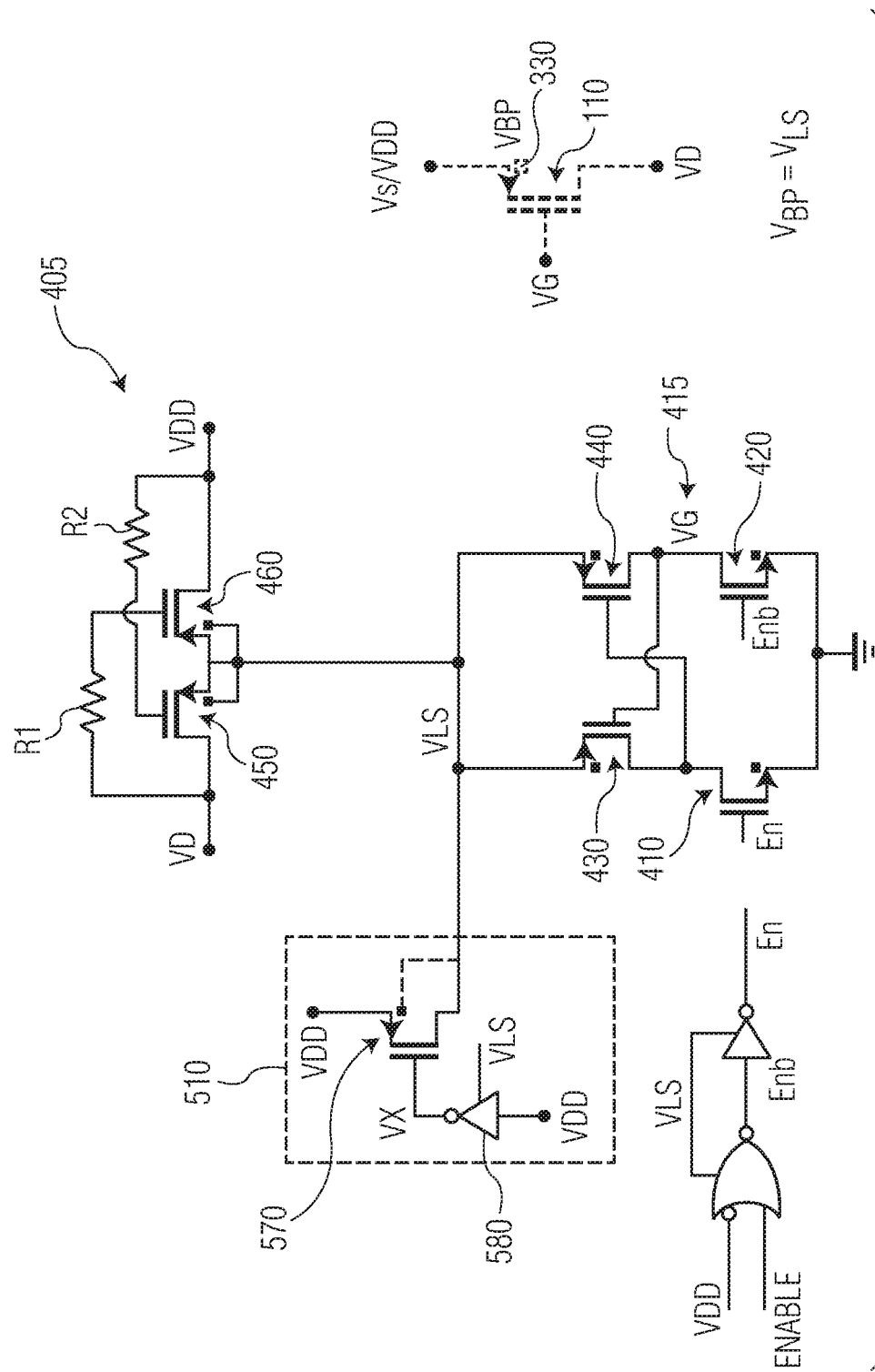

FIG. 5 illustrates a control circuit to make a low leakage PMOS switch with guaranteed no impact on normal mode when VDD is available.

DETAILED DESCRIPTION

It should be understood that the figures are merely schematic and are not drawn to scale. It should also be understood that the same reference numerals are used throughout the figures to indicate the same or similar parts.

The descriptions and drawings illustrate the principles of various example embodiments. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various example embodiments described herein are not necessarily mutually exclusive, as some example embodiments can be combined with one or more other example embodiments to form new example embodiments. Descriptors such as "first," "second," "third," etc., are not meant to limit the order of elements discussed, are used to distinguish one element from the next, and are generally interchangeable. Values such as maximum or minimum may be predetermined and set to different values based on the application.

Example embodiments described herein may ensure that a circuit stays off during a no-power condition. The circuit provides little to no leakage at a pin when Vpin≤Vsupply, and even in the case where Vpin>Vsupply=0V. Example embodiments may take up a small area. There is lithe to zero current consumption, and there is little to no impact on a normal functionality of a switch. Example embodiments provide a negligible loading effect on a pre-existing leaky PMOS switch to bring it down to lithe to zero leakage. These factors contribute to the disclosed circuit having low complexity with minimum implementation risk. Although the disclosure may discuss standalone PMOS transistor switches, example embodiments may include a PMOS switch.

Figure 1:
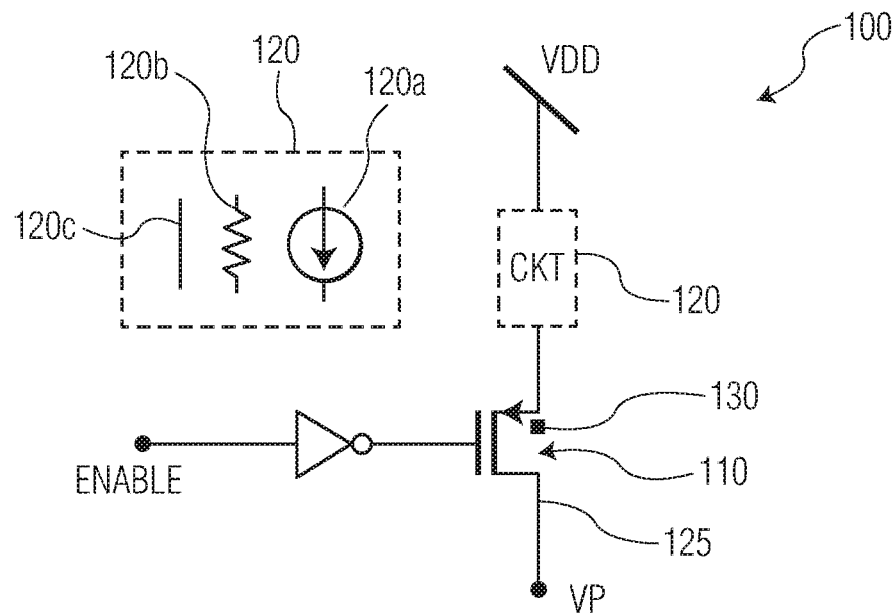
FIG. 1 illustrates a switch connected to a Pin in accordance with example embodiments described herein.
Figure 2:
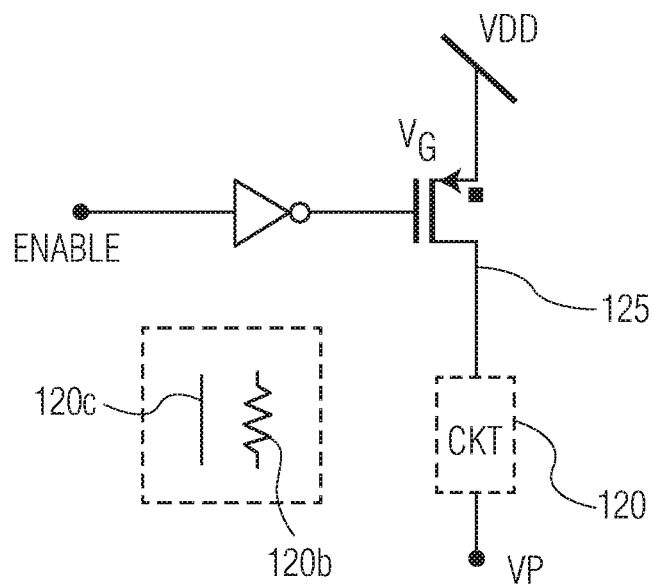

FIGS. 1 and 2 illustrate a circuit 100 in which a low leakage path may be used when a PMOS switch 110 is off. A circuit 120 is disposed between a power source VDD and a source 110a of the PMOS switch 110. The circuit 120 may include a current source 120a, a resistor 120b or a short connection such as a wire 120c. A drain side 110b of the PMOS switch 110 may be connected to a circuit pin, designated Vp. The PMOS switch 110 may be used in a USB Type-C switch, a re-driver with a 50Ω termination, or a resistor divider that acts as a common mode keeper (CMK) when connecting a resistor 120b (or current source 120a) through the PMOS switch 110 to a supply VDD. The PMOS switch 110 may be used in Type-C applications. A bulk region 130 of the PMOS switch 110 is connected to the supply VDD.

In a dead battery mode, VDD may be set to zero for misleading the resistor 120b termination. In a normal mode, VDD may be set to zero by showing a wrong termination. Extra leakage may reduce an actual value of an impedance that can be seen at the pin. This impedance change due to extra leakage may be misleading due to the Type-C universal serial bus power delivery (USBPD) standard.

There are applications in which Vp may equal zero and a set impedance may be seen at pin Vp (for example when Rin>10K). This may mean that a very low leakage current is required for the pin in an absence of a supply voltage.

Many circuits may connect to the pin Vp, such as termination and CMK circuits. A total leakage current that goes to these paths may be very small (e.g., less than 0.5V/ 10K=50 uA over PVT to show larger than 10K resistance to meet a USB compliance tests).

Previously used low leakage switches had a problem in which the voltage rose up to one diode voltage (0.7V) below a greater voltage of a supply and a pin (VDD, Vpin). This drop may be anywhere between 0 V and ~0.7V, which is a sub-threshold region of a diode or a transistor.

These situations may cause a leakage from the Pin to the supply VDD that makes the low leakage PMOS switch 110 a leaky switch at a condition with higher than maximum allowed back-current. A technique is presented to overcome this issue.

FIG. 2 illustrates another arrangement in which the circuit 120 may be disposed between the drain 110b and the pin Vp. If the current through the circuit 120 is zero, a voltage at the drain 110b will be equal to Vp. In practice, the voltage at the drain 110b is not equal to Vp, but both scenarios may exist.

FIG. 3 illustrates a low leakage circuit in accordance with example embodiments described herein. As illustrated in FIG. 3, a bulk region 330 of PMOS switch 110 is connected to a control circuit 350. In The PMOS switch 110 it is desired to have little to no leakage current. In FIG. 3, the gate 340 of the PMOS switch 310 and the bulk region 330 of the PMOS switch 310 may be controlled by the control circuit 350 to prevent leakage at the pin Vp. Using the control circuit 350, the bulk region 330 may be connected to a high voltage to supply the bulk region 330 with a constant reverse diode effect. The high voltage may be from the supply VDD or from the drain voltage VD.

If VDD is available, an automatic selection between VD and VDD may be performed to find the greater value thereof, and the higher voltage will be applied to bulk region 330 by the control circuit 350. Without the implementation of the control circuit 350, when VDD=0 V and the PMOS switch 110 is supposed to be off, the PMOS switch may undergo leakage at the pin Vp. External circuits that are connected to Vp may draw on this leakage current and cause system error.

FIG. 4 illustrates a more detailed view of the control circuit 350 in accordance with example embodiments described herein. In FIG. 4, the PMOS switch 110 is illustrated for reference. The control circuit 350 may include several parts including a comparison circuit 405 and a latching circuit 415. The comparison circuit 405 may be used to select a greater voltage from the PMOS switch 110 to be applied to the bulk region 330. A greater voltage of the PMOS switch 110 may come from either the VDD power supply that is applied to a source of the PMOS switch 110, or from a pin Vp, analogous to the drain voltage VD.

The comparison circuit 405 may be connected between the power supply voltage VDD and the drain voltage VD. A pair of PMOS transistors 450 and 460 may be arranged in series between the power supply voltage VDD and the drain voltage VD. Sources of the PMOS transistors 450 and 460 may be connected together and jointly connected to the bulk regions of the PMOS transistors 450 and 460. Respective bulk regions of the PMOS transistors 450 and 460 are connected together at node 455. Node 455 connects to the latching circuit 415. The latching circuit 415 is configured to control leakage in the PMOS switch 110 in accordance with example embodiments described herein.

As illustrated in FIG. 4, NMOS transistor 410 and NMOS transistor 420 may be large enough to ensure feedback strength. The node VLS is equivalent to the node VBP of the PMOS switch 110. VBP represents a voltage on the bulk region 330. If current being drawn from VLS is large, a leakage current may be present on NMOS transistors 410 and 420. In this case there is no control applied to them because PMOS transistors 450 and 460 may be in a subthreshold region. VLS may be up to one diode voltage lower than the greater of VDD and Vpin.

Designing PMOS transistors 450 and 460 to be large will make the current-resistance drop across their DBS diode low but will load a drain of the PMOS switch 110 and impact the node VD (or Pin) performance in normal operation. There may be no guarantee that a voltage drop stays zero. In FIG. 4, when VDD is 0V, VLS will be a greater of VDD and Vpin, which in such a case will be Vpin. This leads to VBP being the same as Vpin.=Max (VDD, Vpin)=Vpin, which leads to VBP=Vpin. Diodes D1 and D2 may be formed at upper regions of the latching circuit 415. The voltage potential may lead to the diodes D1 and D2 being reverse biased, which may lead to zero leakage current in the latching circuit 415. However, in some conditions, there is a voltage drop across the diodes D1 and D2, and a leakage current occurs. Conditions may include when considering the VLS node as a source. If current drawn from VLS is zero, VLS will remain a greater of VD or VDD. If for any reason some current is drawn from VLS, the VLS voltage will drop. For example, transistors 440 and 420 and/or transistors 430 and 410 may be partially on due to a subthreshold condition that may occur when En and inverse En are not real (0/1) or (1/0). Such a partial condition may sink current from VLS that causes a drop on the VLS voltage.

In FIG. 5, a shorting circuit 510 is added to the example embodiment of FIG. 4 to reduce a leakage current that may occur in some conditions. The shorting circuit 510 may include a PMOS transistor 570 and an inverter 580. The inverter 580 may receive a signal from VDD and input a result into a gate of the PMOS transistor 570. The inverter 580 may receive power from the node VLS. A bulk of the PMOS transistor 570 may connect to the drain of the PMOS transistor 570, and to the node VLS.

In a normal operation mode, when VDD has a positive value such as 1.8V, VLS will be connected to VDD. More specifically, as illustrated in the shorting circuit 510, a positive value on VDD will bring the inverter 580 output to zero. In PMOS operation, a zero voltage on the gate turns the PMOS transistor 570 on, which will short VDD to VLS, lifting node VLS up to VDD. The PMOS transistor 570 will be on in normal operation mode. The bulk voltage will then be the same as the drain voltage. In FIG. 5, VLS is being used as source of En 410 and Enb 420 logic gates. Applying VLS as illustrated may provide a different logic scheme based on using VLS as a source.

When VDD is zero, and no leakage current is desired, an output of the inverter 580 will be one. The PMOS transistor 570 will be off. Node VLS will then be equal to the voltage at the drain, VD, which is the voltage at the pin Vp. The bulk region 330 will then be connected to VD, and Vp.

Example embodiments may be added to any PMOS switch (even if it is part of a CMOS switch) to make it low leakage. Resistors R1 and R2 may provide electrostatic discharge (ESD) protection for the gates of PMOS transistors 450 and 460. Resistors R1 and R2 may each have a value of a few hundred ohms.

Example embodiments described herein allow little to no impact on switch performance and normal functionality of a PMOS switch. Example embodiments may ensure that a switch stays off during power up. Example embodiments may ensure that a switch stays off when a power supply=0. As described herein, a low leakage PMOS switch is provided with little to no leakage. When a supply is not available, the switch is off. Example embodiments may ensure negligible loading on the drain side of the PMOS. There is little to no leakage when VDD=0V and when Vpin=0.5V, for example during a compliance test. The control circuit described herein may be used in USB Type-C applications, linear and limiting re-driver circuits, and more.

Although the various example embodiments have been described in detail with particular reference to certain exemplary aspects thereof, it should be understood that the invention is capable of other example embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

The invention claimed is:

1. A low-leakage switch control circuit, comprising:
   a PMOS switch having a first node for receiving a first voltage, a gate, a bulk region, and a second node for receiving a second voltage;
   a comparison circuit coupled to the first and second nodes and configured to determine and output a greater of either the first or second voltage;
   a latching circuit coupled to the comparison circuit and configured to bias the gate and the bulk region of the switch using the greater of the first or second voltages.

2. The control circuit of claim 1,
   further comprising a shorting circuit configured to control a voltage at the bulk region to ensure that no leakage current flows from the second node.

3. The control circuit of claim 1,
   wherein the first voltage is a supply voltage and the second voltage is a drain voltage; and
   wherein the comparison circuit includes a pair of PMOS transistors connected in series, and is configured to determine the greater voltage between the supply voltage and the drain voltage of the switch.

4. The control circuit of claim 3,
   wherein the comparison circuit includes a plurality of resistors configured to provide electrostatic discharge protection for gates of the PMOS transistors.

5. The control circuit of claim 3,
   wherein the pair of PMOS transistors are coupled at their respective source regions.

6. The control circuit of claim 3,
   wherein pair of PMOS transistors are coupled at their respective bulk regions.

7. The control circuit of claim 6,
   wherein the pair of PMOS transistors respective bulk regions are connected to a node of the latching circuit.

8. The control circuit of claim 1,
   wherein the latching circuit includes a PMOS latch and an enabling circuit.

9. The control circuit of claim 2,
   wherein the shorting circuit includes an inverter to receive a supply voltage and a PMOS transistor to receive an inverse of the supply voltage from the inverter.

10. The control circuit of claim 9,
    wherein a bulk of the PMOS transistor is connected to the bulk region of the PMOS switch.

11. The control circuit of claim 9,
    wherein the inverter receives power from the bulk region of the PMOS switch.

12. A method of limiting switch leakage, comprising:
    determining and outputting using a comparison circuit a greater of a first or second voltage between the first voltage at a first node of a PMOS switch and the second voltage at a second node of the PMOS switch;
    biasing a gate and a bulk region of the switch, with a latching circuit, using the greater of the first or second voltages.

13. The method of claim 12,
    controlling a voltage at the bulk region using a shorting circuit to ensure that no leakage current flows from the pin node.

14. The method of claim 12,
    wherein the first voltage is a supply voltage and the second voltage is a drain voltage; and
    wherein determining the greater voltage includes determining the greater voltage between the supply voltage and the drain voltage of the switch.

15. The method of claim 14,
    wherein the comparison circuit includes a pair of PMOS transistors coupled in series at their respective source regions and bulk regions.

16. The method of claim 14, comprising providing electrostatic discharge protection for gates of the PMOS transistors using a plurality of resistors of the comparison circuit.

17. The method of claim 12,
    wherein the latching circuit includes a PMOS latch and an enabling circuit.

18. The method of claim 13,
    wherein controlling the voltage at the bulk region includes the shorting circuit receiving through an inverter a supply voltage and a PMOS transistor receiving an inverse of the supply voltage from the inverter at a PMOS transistor.

19. The method of claim 18,
    wherein a bulk of the PMOS transistor is connected to the bulk region of the PMOS switch.

20. The method of claim 18, wherein the inverter receives power from the bulk region of the PMOS switch.

\* \* \* \* \*